US006618851B1

(12) United States Patent
Zundel et al.

(10) Patent No.: US 6,618,851 B1
(45) Date of Patent: Sep. 9, 2003

(54) METHOD AND APPARATUS FOR STATE-REVERSION

(75) Inventors: Robert E. Zundel, Wilsonville; Doug Mullin; James Synge, both of Portland; Scott Borduin, Lake Oswego, all of OR (US)

(73) Assignee: Autodesk, Inc., San Rafael, CA (US)

( * ) Notice: Subject to any disclaimer, the term of this patent is extended or adjusted under 35 U.S.C. 154(b) by 0 days.

(21) Appl. No.: 09/387,751

(22) Filed: Aug. 31, 1999

(51) Int. Cl.⁷ .................................................. G06F 9/44
(52) U.S. Cl. ............................. 717/3; 717/120; 711/156
(58) Field of Search ............................ 717/3, 100, 101, 717/120, 127, 168; 711/1, 156, 166, 170, 160

(56) References Cited

U.S. PATENT DOCUMENTS

| | | | | |
|---|---|---|---|---|
| 4,024,507 A | * | 5/1977 | Berkling et al. | 711/170 |
| 5,113,521 A | * | 5/1992 | Mcken et al. | 714/15 |
| 5,204,964 A | * | 4/1993 | Bowden, III et al. | 709/102 |
| 5,257,354 A | * | 10/1993 | Comfort et al. | 714/16 |
| 5,305,389 A | * | 4/1994 | Palmer | 382/305 |
| 5,355,483 A | * | 10/1994 | Serlet | 711/154 |
| 5,392,292 A | * | 2/1995 | Davis et al. | 714/7 |
| 5,481,710 A | * | 1/1996 | Keane et al. | 709/320 |
| 5,611,043 A | * | 3/1997 | Even et al. | 714/38 |
| 5,721,918 A | * | 2/1998 | Nilsson et al. | 707/202 |
| 6,063,126 A | * | 5/2000 | Borduin | 703/2 |
| 6,105,147 A | * | 8/2000 | Molloy | 714/16 |
| 6,247,042 B1 | * | 6/2001 | Engstrom et al. | 709/107 |
| 6,324,692 B1 | * | 11/2001 | Fiske | 717/171 |

OTHER PUBLICATIONS

Wilson et al, "Demonic memory for process histories", ACM pp 330–343, 1989.*
Kruskal et al, "Efficient synchronization on multiprocessors with shared memory", ACM pp 218–228, 1986.*
Pal et al, "Isolation of transaction in object orienetd database systems", ACM CIKM, pp 179–186, 1994.*

* cited by examiner

*Primary Examiner*—Anil Khatri
(74) *Attorney, Agent, or Firm*—Schwabe, Williamson & Wyatt, P.C.

(57) ABSTRACT

A programming environment can be modified to provide automatic support for reverting program memory states. Such memory reversions are used to provide automatic support for state-reversion, undo, redo, and abort operations for application programs written with the programming environment. Memory allocation code (e.g., functions, procedures, etc.) are modified to mark allocated memory as protected, and an exception handler is assigned to such memory. Attempts to access the memory cause an exception to be generated. This exception is caught, providing opportunity for the memory to be preserved before it is modified. Previous memory states can be retrieved by restoring such stored memory states. State-reversion can be effected by creating a new current memory state corresponding to a previous (e.g., retrieved) memory state.

16 Claims, 6 Drawing Sheets

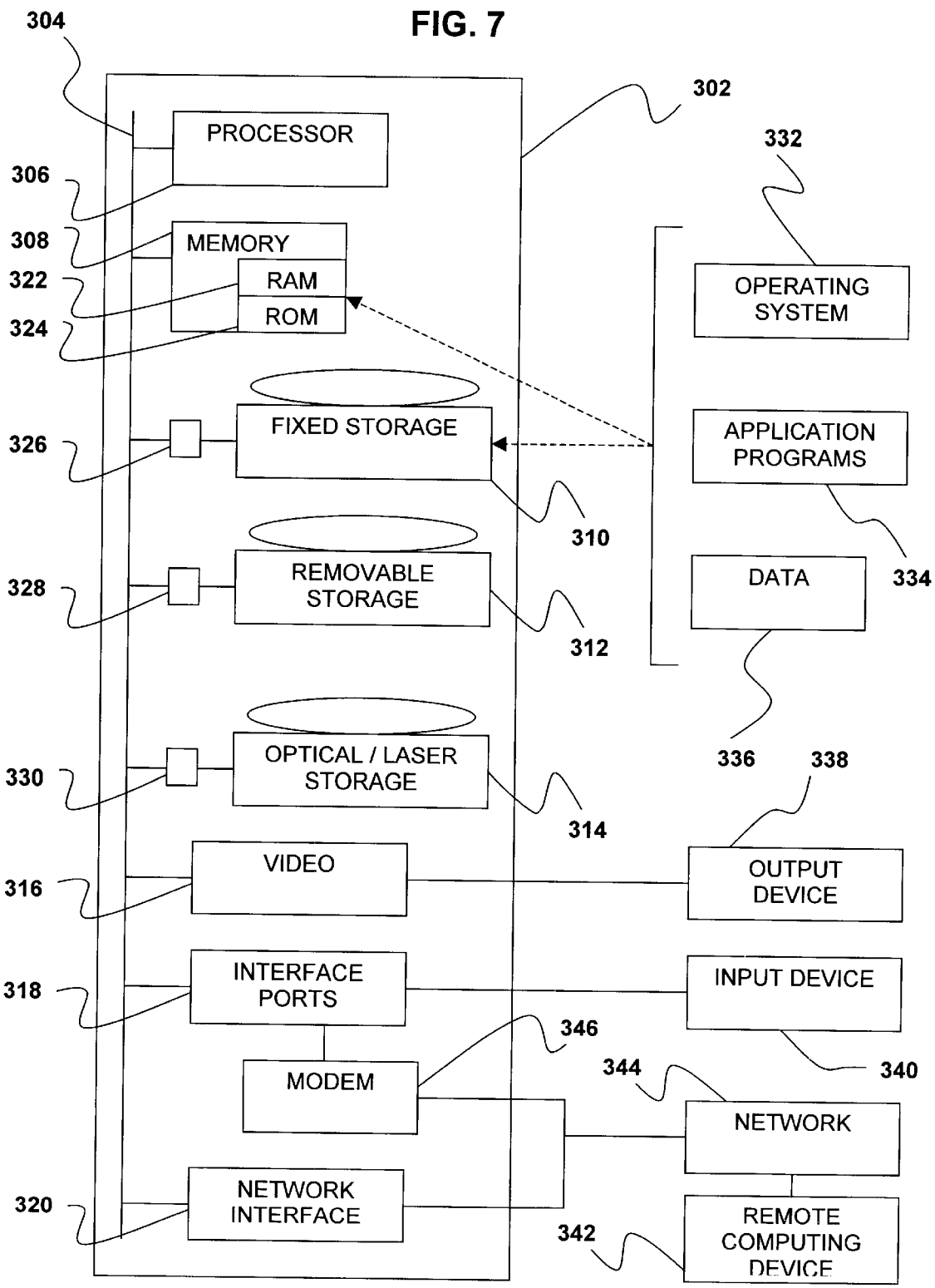

METHOD AND APPARATUS FOR STATE-REVERSION

FIELD OF THE INVENTION

This invention generally relates to the field of application program development, and more particularly to providing automatic support for state-reversion transactions.

BACKGROUND

Providing support for state-reversion operations in an application program is traditionally a complex and error-prone task. For highly complex application programs, such as Computer Aided Design (CAD) projects, the task is particularly difficult. One reason for this difficulty is that CAD designs are frequently revised before a design is deemed completed. For example, designs frequently evolve and change according to revised design goals or when certain features do not yield desired results. Thus, in any particular design session, a designer may make many substantial changes to a design, where each change may then require changes to other components of the design. Consequently, implementation of a robust state-reversion system becomes correspondingly complex.

For brevity, the term "undo", unless indicated otherwise by wording or context, generally refers to state-reversion operations, as well as related undo, redo, abort, and operations. The term state-reversion means reverting a model to an earlier state, like an undo, but where a new current state is created corresponding to the earlier state. Undo is used to generally represent all of these operations, since they can be viewed as particular implementations or variations of disclosed mechanisms for reversing changes made within an application program. The term "reversion" refers to program code implementing such state-reversion, undo, redo, and abort support.

Part of the reason for the difficulty in providing undo support in a solid modeling system, and hence difficulty in providing for state-reversion, is that there are no inverse operations for most Boolean operations applied to objects within a model. Thus, one must capture the details of what has changed at a very low level, e.g., at the data structure level. In addition, many user operations are often ill formed, causing the operation to fail after partial calculation of the user request, and leaving the model in an unstable state that requires correction.

Historically, there have been several methods of incorporating undo support within the source code of an application program. The simplest (and most limiting) has been to save to permanent storage a check-point version of a design in progress. This saved copy can be re-loaded if the design goes awry. There are significant problems with this approach, however. First, restorations are limited to the design as saved. Second, designs can be extremely complex, and significant resources (e.g., processor, memory, storage, etc.) and time can be required to save and re-load designs; this limits the frequency of such backups.

An improved method has been to utilize an object-based history mechanism. That is, design environments typically break a drawing into multiple objects, frequently arranged as a graph. Drawing objects can be made responsible for saving current state information before effecting a change to its state. The saved state information can be used to revert an object to a previous state. However, this approach also suffers several significant shortcomings. One shortcoming is that every object must properly handle reversions (e.g., have appropriate program code to perform an undo). Similar to a chain being only as strong as the weakest link, an entire undo mechanism can be compromised by one object's failure to properly restore its state. Another is that every object must consume Central Processing Unit (CPU) resources to effect the state saving, and may seriously degrade program performance.

Another method has been to maintain a list of inverse operations. If a user rotates an object by ninety degrees, an inverse operation is recorded to undo the rotation. But, this method has shortcomings. One is that performing an inverse operation is generally at least as resource consuming as the original calculation to get to the current state. Another, more problematic shortcoming, is that some operations have no inverse. For example, application of a lossy filter discards original data that cannot be recovered.

Yet another method has been to maintain a history of design actions, where a reversion is effected by re-computing the entire design up to some previous state. This solution is similar to applying inverse operations, and overcomes the problem with lossy operations. However, operations relying on real-time, transient, or random data still cannot be reversed. And, since a design may have a very large number of operations to recreate, this solution can also be extremely slow and resource intensive.

But, each of the above methods places a burden on an application program designer (e.g., the CAD/CAM developer) to design and implement a complex reversion feature. Due to such complexity, a significant portion of application program design time can be expended in order to properly implement it and allow its use throughout the application program. Also, there is no guarantee that it will be implemented correctly. And, since such a feature is integral to an application program, it is unlikely that resulting program code will be easily portable to a different application program.

SUMMARY

Programs and programming environments can be modified to provide automatic support for reverting program memory states, allowing automatic support for state-reversion, undo, redo, and abort operations. Memory allocation code (e.g., functions, procedures, etc.) can be modified to mark allocated memory as protected, and assign an exception handler to such memory. For example, an exception filter can be associated with a memory region, where the filter decides, based on the exception details, whether the exception represents an attempt to modify memory which has been protected. Modifications are caught, providing opportunity to preserve memory before its modification. This allows retrieving previous program states. State-reversion of a model stored in a memory can be achieved by tracking changes to the memory by application of transactions to current states of the model. When a first transaction is received, the model has a first state. Application of the transaction results in a second state. Changes to the memory storing model are tracked between the first and second states. Thus, on receiving a state-reversion request to revert back to the first state, a new current model state can be created, where this current state is equivalent to the first state.

BRIEF DESCRIPTION OF THE DRAWINGS

The present invention is presented by way of example, and not by limitation, in the figures of the accompanying drawings. Like references within the specification correspond to similar drawing elements.

FIG. 7 is an exemplary operating environment for an application program written with the API.

DETAILED DESCRIPTION

Figure 1:
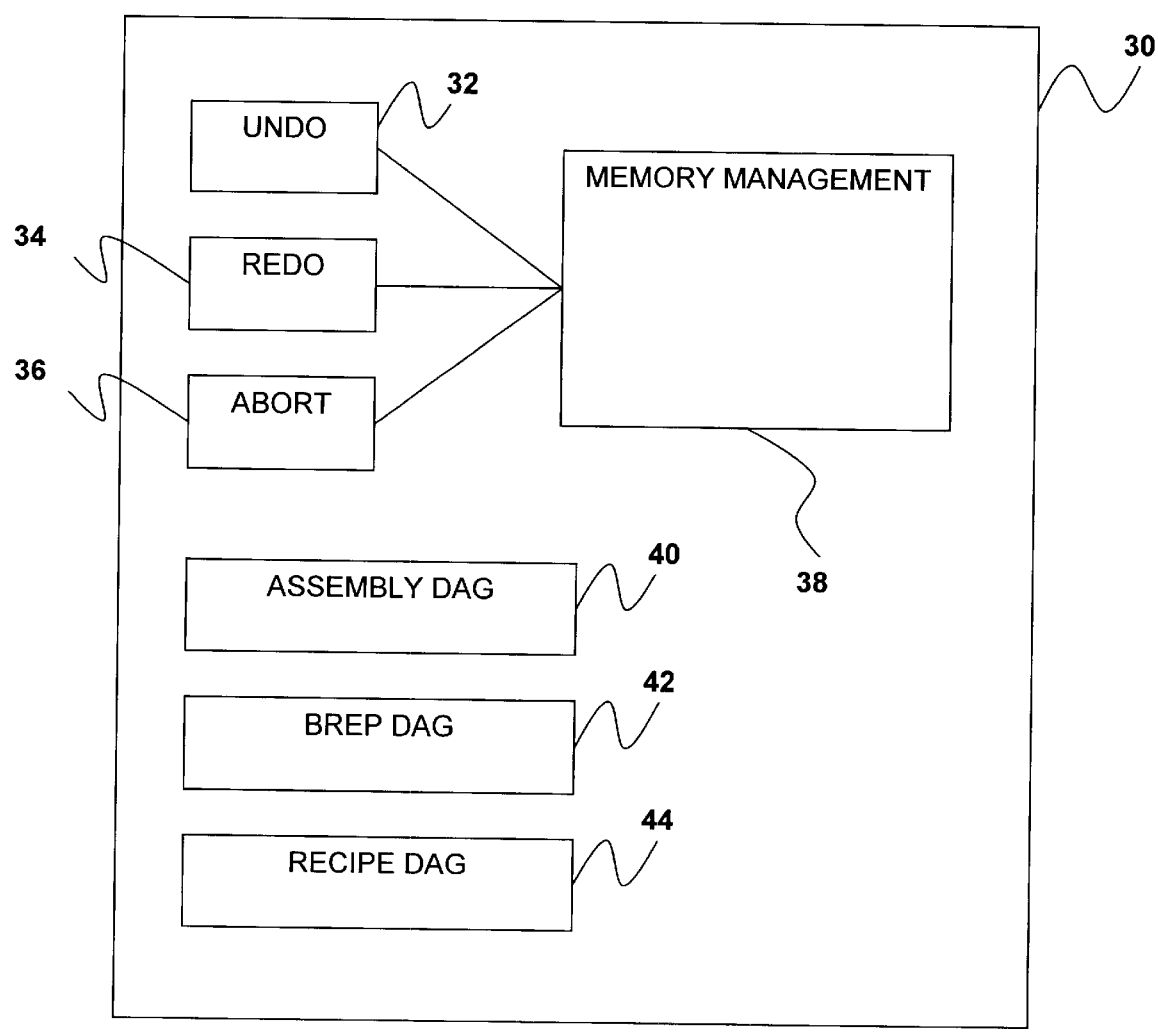
FIG. 1 illustrates portions of a generalized CAD environment.

Instead of requiring an application developer to worry about providing undo support, such support can be made automatic through incorporating functions provided by an Application Programming Interface (API), a programming language, or other programming environment. One particular implementation is to incorporate such support into memory management support for such environments. For example, in a modified API written for C++, the new and delete operators can be overloaded to provide this support. However, to implement this API, it is important to understand generally how a program operates. In general, a program's execution can be viewed from one of two perspectives. A first "traditional" approach is to watch the actions taken by the program. As discussed in the background, various methods can be applied to reverse the effects of the program's taking some action. A second, and better approach, is to track changes made to program memory (e.g., RAM or other permanent storage) which is storing the program's current state as the program operates. It is generally understood that program execution is data driven. As a program runs, user operations cause changes to program data which effect program output (e.g., display) and stored program state data. If changes to display state and stored program state are tracked as they occur, then a particular user operation can be undone by restoring memory storage to its pre-action state. As discussed below, this approach overcomes several prior-art limitations.

Unfortunately, it is not feasible to track every change made to every data bit of memory. Therefore, available memory can be allocated into memory blocks of predetermined size (e.g., a standard system block size). During execution of the user operation, any modified memory blocks are saved for later restoration. For clarity, it is assumed that block saves are performed between known program operation states, e.g., checking for changes only at the end of a transaction. For example, a current memory state can be recorded at the start of a user operation, such as changes to a design. At completion of the operation, the memory state of the blocks is compared to the saved state, allowing identification of changes made by the operation.

Exemplary Application Program

To give context for the API, it is assumed herein that a program developer is preparing a CAD application program with the API. A CAD program, being a highly complex and resource intensive application, illustrates the flexibility of the claimed memory-based approach to reversion tracking.

The term "reversion" is intended to include operation of the invention as incorporated into an API or other development environment. The terms "undo", "redo" and "abort" refer to operations performed by the CAD program written with the API. Undo means to take a CAD design to a previous state. Redo means to undo an undo operation, e.g., to restore program operation to a later program state. Abort, similar to undo, means to stop a program operation and restore program operation to a known previous state, and to forget the changes made during the stopped program operation CAD program execution generally goes through three stages. During the first stage, a user/operator provides program selections, such as clicking on a button or performing a menu-selection, and the program provides feedback such as highlighting a selected button or object. During a second stage, the application program executes a user request that inspects or modifies program data. And, during the third state, the application program updates or displays user interface information in response to the user request, and performs any side effects related to the user request. The term "transaction" is used to refer one or more user-initiated actions ("identified transactions") and program responses thereto ("unidentified transactions").

A transaction is roughly a group of actions which are effectively inseparable, such that they are all either done or all not done. Generally, identified transactions are operations where a user has directed that some change be made to a CAD model. Unidentified transactions are behind the scenes or automatic actions. For example, there are events related to a mouse, such as move, button click, or drag events, that generate events, but are not recognized by the user as a transaction per se. (An event is essentially a notification to a program that some action has occurred.) Unidentified transactions can also include changes to how the model is viewed, but which do not actually change the model itself, as well as program responses to user actions, which include displaying the outcome of an operation by modifying a graphics scene to show a different view, dynamically rotating the model, highlighting selected objects, etc.

FIG. 1 illustrates portions of a generalized CAD environment. Shown are the CAD application program 30 itself, which contains program modules (written using the API supporting reversion) for performing undo 32, redo 34, and abort 36 operations in accordance with the teachings of the invention. The state-reversion, undo, redo, and abort operations each rely on memory management modules 38 described below. The CAD application program 30 is of a type supporting solid modeling of designs, such as the Mechanical Desktop® Release 3 program by Autodesk Inc. of San Rafael, Calif. Program 30 utilizes several Directed Acyclic Graph (DAG) data structures to track design data and design intent. These structures will be briefly discussed to provide a foundation for terminology used throughout this description. These DAGs are presented purely for exemplary purposes—other data structures, such as non-directional graphs, trees, etc., can also be used. And, although discussed separately, it is understood that these DAGs may be combined or arranged differently to achieve equivalent results. For example, BREP and graphics data for a part can be derived from the part's design capture recipe (which contains different types of nodes for parts, assemblies, and drawings).

A first DAG 40 roughly tracks an entire assembly. It is assumed that leaf-nodes of the graph contain individual parts of the assembly, where each part contains graphics primitives, such as the triangles and lines representing information that is presented to a user. This DAG is optimized for reading for rendering and selection. Different Levels of Detail for parts can be stored for a part, as well as data to allow portions of a scene to be spatially sorted to facilitate selection and culling.

A second DAG 42 tracks a solid model boundary representation (BREP) for a part (an integrated collection of objects). This DAG represents the boundary topology and shape of the part. Instead of defining a part as a collection of edges or points, a BREP defines a part with respect to one or more shells. A simple part with no cavities in it will have a single exterior shell. Each shell has one or more faces. Each face contains surface information, such as a plane equation, normal(s), etc, and is bounded by one or more directional (having an inside and outside) loops; thus, a face with a hole in it has an outer and an inner (hole) loop. Loops are defined by a set of edges, each bound by vertices. Edges form boundaries between multiple faces, and hence can be part of multiple loops. In sum, shells, faces, loops, edges and vertices define a polyhedron representing a desired solid. Attributes such as color, shading, orientation, texture, and relation to other objects can be associated with the polyhedron. Shape information is described by associating curve and surface information to the solid's faces and edges, respectively. The graphics primitives of the first DAG 40 are primarily derived by tessellating the faces and edge of the BREP of each part in a design.

A third DAG 44 is a design capture recipe. A recipe tracks a designer's "intent," in terms of parameters, features, and constraints. Essentially, the recipe can be viewed as a "qualitative" sequence of steps required to recreate an assembly, or part thereof. That is, a recipe in not a quantified sequence of steps to create the design. Instead, as drawing elements are designed, a sequence of constraints are stored to characterize each element. For example, rather than defining a cube object as having a particular fixed size, instead a side of the cube is drawn as a rectangle (four lines connected in a loop, opposite lines constrained to be parallel, adjacent lines constrained to be perpendicular), with two adjacent sides then constrained to be equal in length. Next, a dimension is added to one edge, allowing the user to adjust the size of the square with a single parameter. To transform this square into a cube, the square is extruded using the length of a side of the square as the distance of the extrusion. Thus, the size of the cube can be varied by changing a single parameter, and the constraint system will maintain the shape. Assembly information for graphs, as well as graphics primitives for sketches and other graphical feedback objects (e.g., grids, workplanes, etc.) are derived from the third DAG.

When a transaction is committed, the constraints and state are added to the design capture recipe, which is then evaluated to modify the topology and geometry of the BREP. The BREP is then retesellated. A tesellated object is one having an appearance derived from a contiguous arrangement of simpler objects, typically triangles. Complex object surfaces can be represented by a combination of one or more basic object shapes, such as splines, non-uniform rational splines (NURBs), texture maps, and polygons. Executing commands typically requires two high-level transactions each, a first which ends a current unidentified transaction, and a second which ends an identified transaction in which the design capture recipe and BREP are changed). The changes to the recipe cause events to be broadcast which cause views (windows) to be 'invalidated', leading to them being repainted after the command finishes.

In a user run command, for example, an identified transaction adds constraints and states to the design capture recipe, which is then evaluated to modify the topology and geometry of the BREP. The changes to the recipe and BREP cause events to be broadcast which invalidate the approximate graphics representations of the BREP. The identified transaction then commits. A subsequent unidentified transaction begins immediately, and starts by repainting the scene. The invalidated graphics representations are replaced by regenerating them from the BREP in order to display the results of the operation. The unidentified transaction then continues while the user re-displays the model from different views, makes selections, and enters the input for the next operation. (This input is typically validated via temporary, dynamic graphical feedback on the display.) When the input is ready, the user invokes the next command, which automatically commits the unidentified transaction, and then begins the subsequent identified transaction.

Figure 2:
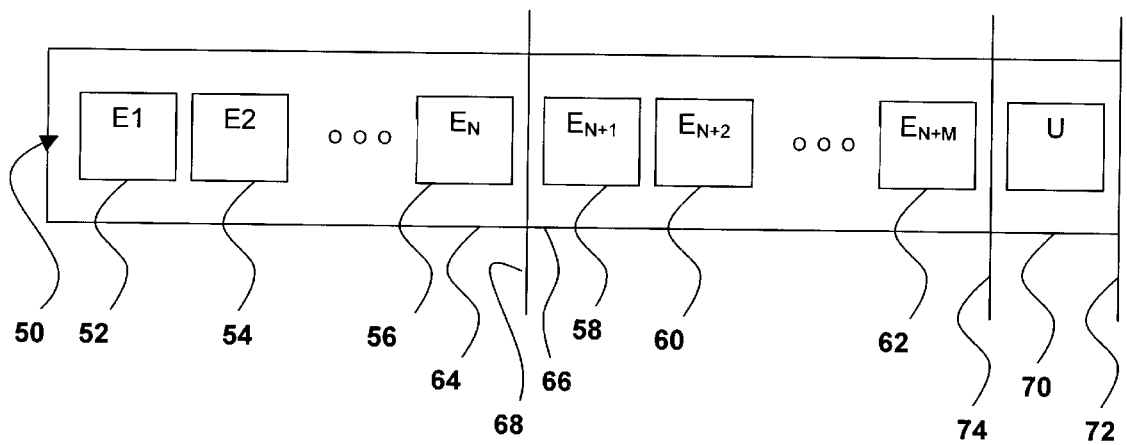
FIG. 2 shows an event line representing a sequence of operations during execution of an application program.

FIG. 2 illustrates an event line 50. An event line is analogous to a timeline, and represents a sequence of user-driven operations taken by an application program. All program activity can be viewed as a sequence of events E1 52, E2 54, etc. occurring over time. Events are defined by user action and program response thereto, and are grouped together to define "transactions." As shown, there are three transactions 64, 66, 70. For simplicity, it is assumed that one transaction starts 68 where a previous transaction ends 68, since having gaps between transactions can prevent undo/redo operations unless complex tracking is used. Consequently, it is assumed that no event can be recorded by the transaction system unless there is an active transaction.

For example, the first transaction 64 may represent initialization of a CAD application program. Note that initialization can occur before (e.g., outside of) the transaction monitoring system is started, since there are no actions at that time which we want the user to undo, and hence no need to be able to undo program initialization. Events E1 52–$E_N$ 56 can be acquisition of program memory via appropriate API memory allocation functions, and other actions necessary to initialize the CAD program. After initialization, the second transaction 66 may represent a user's defining an object, such as a triangle, within the CAD environment. Events $E_{N+1}$ 58 through $E_{N+M}$ 62 can be the user's selection of a triangle creation operation, selection of where within a drawing to place the triangle, as well as sizing and attribute selections. As noted above, transaction granularity is arbitrary and more or fewer actions may be included within each transaction 66.

Now assume that the third transaction 70 is an undo operation for the triangle creation transaction 66. This operation can be seen as either trimming the event line 50, so that it stops at boundary 68, or as causing program state as it existed at boundary 68 to be made available at the undo transaction ending boundary 72. Although effectively the same result, if viewed in the latter context, one can treat the undo transaction 70 as just another transaction that itself may be undone. Undoing the undo transaction, e.g., performing a redo operation, would bring program state back to as it existed at transaction boundary 74. The state-reversion, undo, redo and abort operations employ the first approach of "trimming" the transaction history, without creating a new transaction, by moving a boundary between the past and future events without losing the future events. The rollback operation employs the latter method of making a new program state at boundary 72 that is equivalent to the earlier boundary 68.

Note that discussion has focused on bringing program state to its configuration at some transaction boundary 68, 74. These boundaries represent the granularity of the undo system. Intermediate states, e.g., $E_1$–$E_N$, are therefore unrecoverable. Generally, transactions are deemed to start at the beginning of user-recognizable points in time, such as when a user initiates some program operation, and end after the application program has completed responding to the operation.

Figure 3:
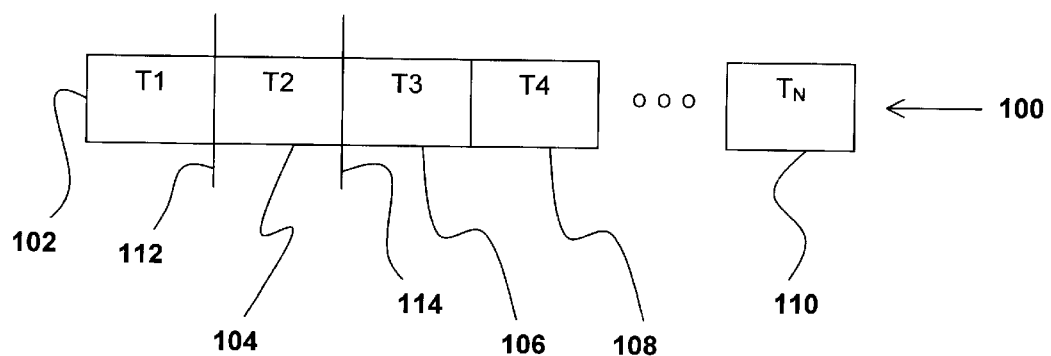
FIG. 3 shows a transaction timeline.

FIG. 3 shows a transaction timeline 100. As discussed for FIG. 2, a transaction is a collection of one or more actions. Assume that a user desires to edit a previously created feature or constraint (which is associated with an operation). Similar to an undo operation, an edit operation requires obtaining a previous program state. However, an edit operation is more complex since it involves stepping back through a design's recipe, changing something, and then recomputing the design. It is presumed that relationships between design objects are stored as a system of design constraints, so that an edit operation can be accounted for by re-solving the design constraints according to the edited value(s). As with other transactions, an edit operation can also be undone.

Shown are a series of transactions T1 through $T_N$ 102, 104, 106, 108, 110 that have occurred during execution of an application program written with the API supporting reversion. Assume that after performing transaction T2 104 in a design, a user applies an edit operation to transaction T1 102. This corresponds (in the exemplary CAD application program) to rolling back the BREP to its previous state as it was before performing T1 102 (displayed graphics can be rolled back as well). A user can then modify the recipe (e.g., adjust a part size), and allow the design to be re-evaluated according to the changed information. In one configuration, to rollback a BREP, a copy is made of the BREP. The copied BREP is then tesselated for display so that the user can adjust parameters. Later, after a user has approved changes, the "original" BREP is rolled back, and the use changes applied to this "original" (e.g., non-copy) BREP.

By stepping back through the recipe, a designer can change an object in the design without having to manually change all other related objects. For example, if 50 objects are related to a cube, in a non-constraint based system, changing the length of the cube can require all related objects to be adjusted to account for the change. By storing design information as a recipe of constraints, when the cube is modified, a CAD system can automatically re-solve relevant constraints and account for the change. (In the process of resolving all constraints, the topology and geometry of the design may alter dramatically.) Similarly, using a constraint system allows one to sequence through a recipe and insert a new object into the design and re-solve the constraints. Or, one can evaluate "what if" configurations by changing parameters to test their impact on an overall design.

As with providing undo support, for any other change operation, these edit operations are "captured" so that this operation may itself be undone if necessary. Towards this end, when the design recipe rollback occurs, the roll back operation generates nested transactions T3 106 which includes the rollback request, the edit operation itself, as well each original transaction which is re-computed. The identity of each nested operation is associated with the original recipe step so we can revert to it for subsequent edits. Roll backs can occur to any of these nested steps. Note, however, that undo operations are assumed to affect entire edit operations. (As discussed below for FIG. 4, each transaction's changes to memory are recorded for later reversion.) By encapsulating the edit operation as a transaction, the edit operation becomes another transaction subject to an undo request.

So, if an event T4 108 is an undo operation for edit transaction T3 106, rather than deleting transaction T3, instead (like with the edit operation) transaction T4 corresponds to actions needed to undo the edit operation (which can include a rollback transaction to track the BREP modification). Thus, at the completion of transaction T4 108, program state is as it was at the end 114 of transaction T2 104. But, by being encapsulated in transactions, the undo 108 operation can itself be undone, thus restoring program state as it was after the edit transaction 106.

Undoing an undo operation is called a "redo" operation. As with normal undo operations, performance of a redo requires knowing all states that have occurred since the current transaction. State changes are recorded by the transaction system using bulletins. Different resources may or may not be subject to the transaction accounting system; those resources whose changes can be tracked have an associated bulletin describing changes to the resource and/or provision for reversing such change. A bulletin is required to be able to build a list of all state (e.g. memory) changes that occurred for the bulletin, so that the memory changes can be applied to result in a final memory state corresponding to the bulletin's initial state. Thus, a user may elect, at transaction $T_N$ 110, to undo all transactions back to transaction T2 104, the beginning of which is the end 112 of T1 102, and then subsequently decide to redo transactions through transaction T10 (not shown; assume T10<$T_N$).

After applying the memory changes, instead of discarding the intermediate states, one can elect to keep the redo information, and the recovered transaction T10 state is adopted as a new current state $T_{N+1}$. In particular, since it is known that transaction $T_{N+1}$ is now identical to transaction T10, a link can be defined between the two states to allow a jump over intervening states. Such a facility might be useful if a user performs subsequent transactions $T_{N+2}$ through $T_{N+10}$, and later decides to undo all transactions to some point before transaction T10. Rather than performing the undo operation for intervening steps, the link provides an undo shortcut. Maintaining the undo information and adopting a new state corresponds to performing a state-reversion. It is understood that the state-reversion may incorporate an edit operation as applied to an earlier state, where this edited state is adopted as the new current memory state. The edit operation can be a partial edit, where just the BREP is rolled back to the earlier state, the model edited, and the subsequent recipe operations from later states re-applied to form a new (modified) current state.

The undo shortcut method is used to implement the rollback operation. However, as discussed above, with undo and redo, a new transaction is not created. Instead, bulletins are executed backward or forward as needed. But, after performing an undo, when a new subsequent transaction commits, the undone transactions and all of their associated bulletins are truncated, rendering them unavailable to a redo operation.

Note that there is an issue with respect to memory that has been allocated in a later transaction that has been undone to an earlier transaction. When undoing transactions, subsequently acquired memory should not simply be freed, since it might not be available if a redo operation is performed. In particular, application programs that expect objects to be loaded in memory at certain locations (with pointers within and to such objects), will require the memory to be available for a redo. Consequently, after a rollback operation, the previous (now restored) transaction state is informed that it has acquired extra memory space (e.g., that memory is marked as free). The memory is not released so that undoing a memory deallocation allows an object to be restored to its same address in memory.

Alternatively, if memory resources are scarce, the original memory can be freed, and if a redo is performed, all memory references to the original memory are revised according to a new memory location acquired during the redo operation. One way to implement address revision is to make groupings of addresses be relative to a base address value. On reacquisition of memory, the base address is set to the reacquired memory's location, thus minimizing revision efforts.

Note also that either a linear list or hierarchical tree can be used to track operations and related program states. In a linear system, if a new transaction is completed after performing an undo operation, then all undo information corresponding to future transactions can now be discarded. That is, if after some transaction $T_N$ 110, a series of undo transactions occur to take program state back to T2 104, and then a new transaction T3' 106 (T3 prime) is completed, then all redo information for the previously performed transactions T3 106 through TN 110 can be discarded.

However, it may be useful to provide what-if capabilities to the application program by preserving undo transactions in a tree. A branch operation can be implemented each time a transaction would otherwise delete the previously recorded transactions. Thus, instead of replacing transaction T3 106, a new hierarchy leaf-node T3' is created, while the previous T3 through TN series is left intact. A visual interface can be provided to allow one to choose an active path through the hierarchy.

Undo operations may be complicated by having transactions occurring in multiple files. For example, a CAD assembly document A can contain two parts, each respectively located in incorporated documents B and C. If several transactions are performed in all three documents, then the undo operations can get complex as the transaction history may include transactions from both A, B and C. In particular, the current document focus may be in document B, even though the last transaction occurred in A. Consequently, an undo operation in B will result in a change to A, not B, and may be confusing to a user. To alleviate confusion, a user interface can be used that notifies the user of such indirect effects from an undo operation. Alternatively, program display can be adjusted so that each affected document is temporarily displayed while relevant transactions are undone.

Figure 4:
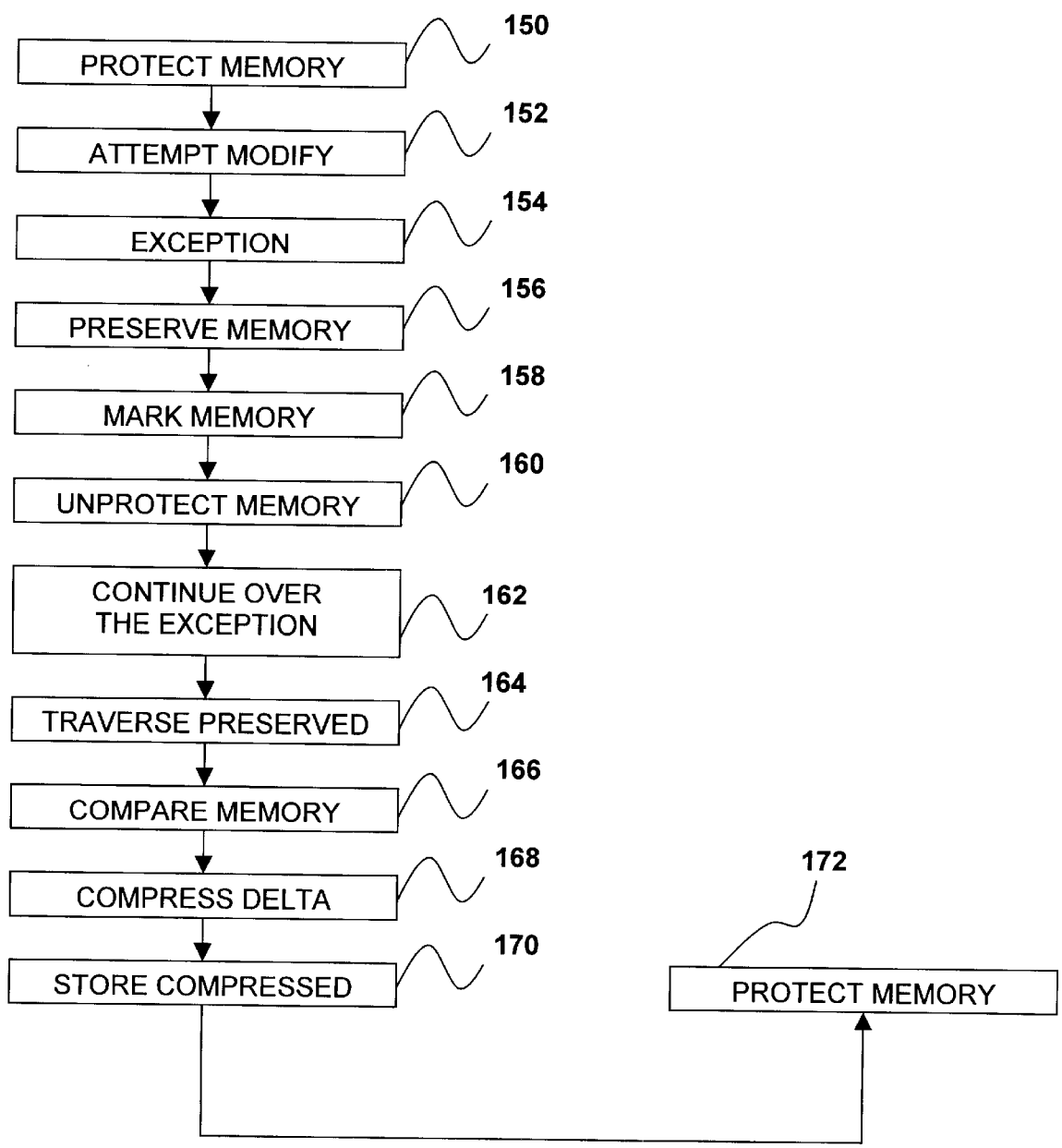
FIG. 4 is a flowchart for one method of implementing reversions in an API.

FIG. 4 is a flowchart for one method of implementing reversions in an API, so as to allow CAD program state to be reset to transaction boundary states as discussed above for FIGS. 2 and 3. Shown is a flowchart of one approach to protecting memory to provide reversion allowing application program's to offer state-reversion, undo, redo, and abort operations.

As discussed above, the general approach is to take a "snapshot" of memory at the beginning of a transaction, and to then save memory changes, post-transaction, for undo purposes. No work needs to be performed by an application program or data objects in order to implement tracking the memory changes since changes are tracked at the operating system level, e.g., through registering protection/exception handlers with a virtual memory facility. Additionally, memory changes only occur one time per memory page per transaction, and the backup mechanism remains completely transparent/automatic to application programmers. This contrasts the traditional approach of requiring each object to track changes and maintain the ability to revert the object to an earlier state. In addition to the complexity of properly flagging and tracking every object that has changed, this approach also requires strict and accurate conformity by every programmer on every data modifying block of code written; if any one programmer fails to properly implement tracking changes for an object, then the whole system degenerates.

From an API user/program developer's perspective, transactions are arbitrarily defined within an event stream, and therefore the developer is required to call a first API function that flags the start of a transaction, and then call a second API function to indicate that the transaction has been committed (completed), or aborted (in effect, an undo request for any changes made during the transaction up to the abort). These start/stop notifications are generally placed around user-identified (e.g., user-initiated) transactions. The stop notification can be implied, however, if transactions are presumed contiguous, since a start notification necessarily identifies the end of a previous transaction. If transactions are not contiguous, then an explicit transaction end call is necessary. It is assumed, however, that they are contiguous, with a single API call including an identification of a transaction, the call to execute the request, as well as a commit (or abort on failure) election.

So, at the start of some transaction, memory is protected against write accesses. In particular, as memory is allocated for use by the invention, it is protected during allocation. Thus, any pages of memory allocated to the heap from general system resources during the transaction are also protected. Since memory has been allocated with modified allocation functions, a programmer is guaranteed that the allocated memory is properly protected and backed up automatically. An exception handler is defined to handle attempts to access the memory (e.g., a Win32 SEH filter). By utilizing exception handlers, memory access attempts can be managed automatically at the first attempt to access the memory. The CAD program developer simply writes the CAD program without worrying about how the API implements state reversion.

Memory is allocated and accessed in chunks of predetermined size. For example, 4 kilobyte (K) chunks can be used. The blocking size is arbitrary, within operating system constraints, and should be chosen for program efficiency (e.g., certain block sizes, such as the operating system's virtual page size, are better suited to operating system throughput). Larger block sizes may result in excessive overhead due to backing up regions of memory not actually touched during a transaction. In the exemplary CAD context, the minimum protectable memory block will contain approximately 50–100 typical CAD objects. If the memory allocation scheme clusters objects together well, many objects on the same page can be modified in the same transaction, while only incurring the exception overhead once per page per transaction. This reduces overhead in unnecessarily calling memory exception handlers to track changes to memory state.

Thus, at step 152, a program attempting to modify allocated memory results in the operating system "throwing" a memory access exception; this exception is "caught" by a handler (the throw/catch pairing is collectively referenced as exception 154). (Recall that memory is protected on allocation.) An exemplary exception handler for catching access attempts is a Microsoft Win32 exception handler. The handler temporarily suspends application program execution, and begins execution of handler code instead. At step 156, the current state of the memory is preserved to ultimately allow for application of a program's undo operation. A bulletin object is created in regular (e.g., un-preserved) memory, and is appended to an ordered list of such bulletins. This bulletin tracks the relationship between the memory and the preserved copy of the memory. Generally, for each transaction $T_i$, and sub-transaction thereof (see FIGS. 2, 3 discussion), there can be one or more bulletins associated with the transaction. These bulletins track the nature of a transaction, as well as what is required to undo, cancel, or otherwise reverse the effects of the transaction.

At step 158, the memory is tracked as having been accessed. Tracking can be effected by setting a "dirty" bit after memory has been unprotected 160, or through inspection of bulletins which provide a record of the memory alteration. At step 160 the memory is unprotected, and the handler returns a code indicating that normal processing may continue 162, since the memory is now unprotected. Re-attempting write access now succeeds (rather than throwing another exception). Since memory has been preserved 156 and unprotected, further events during the transaction that attempt to write to the memory occur without overhead.

At transaction commit time, e.g., at the end of the transaction, the list of bulletins (e.g., indicating preserved memory) is traversed 164 and the preserved copy for each memory block 164 is compared 166 against the current state of the memory. In the context of the FIGS. 2, 3 embodiments, a transaction $T_i$ notifies all sub-transactions (of which there may only be one, e.g., the just transaction itself) of the commit, and each sub-transaction notifies all associated bulletins to perform whatever actions are required for supporting state-reversion, undo, redo, abort operations. Generally, this includes performing a bit-wise XOR between the current and preserved memory states resulting in zeros for all bits in the memory region that remain unchanged since the memory was preserved, i.e., since the transaction was started.

Compression can then be performed through application of a lossless encoder such as a Run Length Encoder (RLE), which replaces runs of zeros with a shorter code sequence. If desired, the RLE output can be passed to another encoder, to perform multi-level encoding. The compressed 168 "difference" or delta data is then stored 170 in a memory backup file. It will be appreciated that different comparison and compression methods can be used. After the compressed data is stored, the memory region is re-protected 172, allowing the preservation cycle to repeat upon subsequent attempted modification of the memory.

Special provision can be made for memory regions that are allocated or deallocated (freed) during a transaction. A straightforward method is to add these newly created or deleted regions onto the end of the list of all preserved memory. For allocated memory, the "original" contents of the memory is a zero-filled region. Similarly, for deallocated memory, the resultant memory is a zero-filled region. Then, as the list is traversed, the memory is compared, encoded, and backed up as usual.

During program application execution, a transaction(s) can be undone by decoding stored memory contents and re-applying the XOR operation to get back the original memory configuration at the start of the desired transaction. During normal program operation, memory objects (e.g., a C++ object or the like) are allocated and freed within a memory page, and bulletins are associated with new memory allocations. However, to be conservative, pages that are emptied by deleting objects stored within them are not de-allocated until the event causing its creation can no longer be undone. This conservative approach guarantees that the memory will be available if an undo requires it to be reinstated to a particular state.

Figure 5:
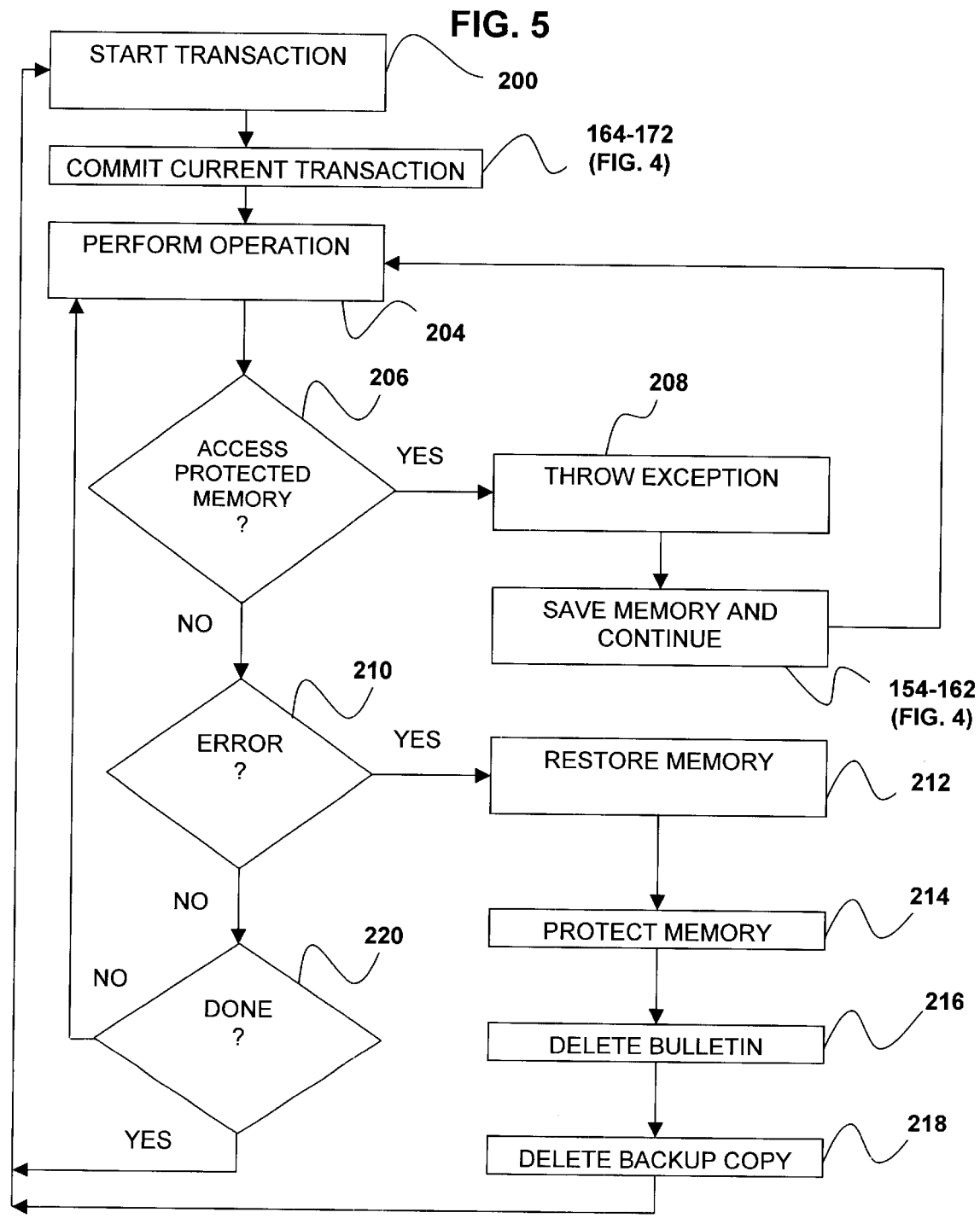
FIG. 5 is a high-level program-operation flowchart illustrating how FIG. 4 operations are called during normal program execution.

FIG. 5 is a high-level program-operation flowchart illustrating how the FIG. 4 operations are called during normal program execution.

As shown, a transaction starts 200. This causes a previous transaction to be committed (assuming abutting transactions), and corresponds to performing operations 164–172 of FIG. 4. After committing the previous transaction, performance of the current transaction is started 204. A check 206 is made to determine whether the transaction affects protected memory. (Typically, for speed, this test is performed in hardware for each write operation.) Such identification, as discussed above, can be implemented by associating access handlers to memory regions, where the handler provides a hook for preserving memory to be modified before it is modified. Thus, if the transaction affects memory, such as by writing to it, the operating system throws an access exception 208 that is caught by a memory handler. As discussed above for FIG. 4, the memory is preserved and marked as accessed (e.g., "dirty") 154–162, and then transaction processing 204 continues. Since an exception handler operates asynchronously of program operation, transaction processing 204 is not "aware" of the diversion to the handler. (If the transaction operation did not attempt to change memory, then the operation would be directly performed since the operating system would not throw an exception.)

After performing the operation, a check 210 (e.g., by the application program) is made to determine whether the operation resulted in some error. Errors include a user command to cancel or undo the transaction in progress, and unexpected exceptions thrown during program execution, such as from an operating system error, or from an error from a mathematical computation. If an error occurred, then memory is restored 212 (if necessary) to its state at the initialization of the transaction, just as if the transaction had been completed and then undone. The memory is then re-protected 214, and any relevant bulletins are deleted 216, and memory backup copies are deleted 218. After an abort/cancel command, associated bulletins and backup copies are deleted as being unnecessary (no action completed), whereas with the undo operation (as discussed above), they are not deleted. Processing for this transaction then ends, and processing continues with the start of the next transaction 200.

If there was no error, a further check 220 is made to determine whether the transaction is done. If so, then processing for this transaction then ends, and processing continues with the start of the next transaction 200. If the transaction is not completed, then processing loops back to continue processing the operation 204.

Note that the operation of FIGS. 4 and 5 are interleaved, and can be implemented in different but analogous steps. In terms of using an API providing automatic undo support, FIG. 4 operation 150 is performed automatically on memory allocation, and operations 152–162 are performed automatically on attempted memory access. However, recall that backing up memory is based on determining differentials between past and present memory configurations. Hence, entire memory pages are considered "dirty" and needing backing up, and unmodified objects within a page are backed up along with modified objects. Operations 164–172 are intended to be the result of manual "commit" functions called by the API programmer; this allows, as discussed above, for transaction boundaries to be arbitrary. When the API programmer deems an operation complete, a single function call invokes appropriate code for steps 164–172 to compress and store preserved changes made to memory.

Figure 6:
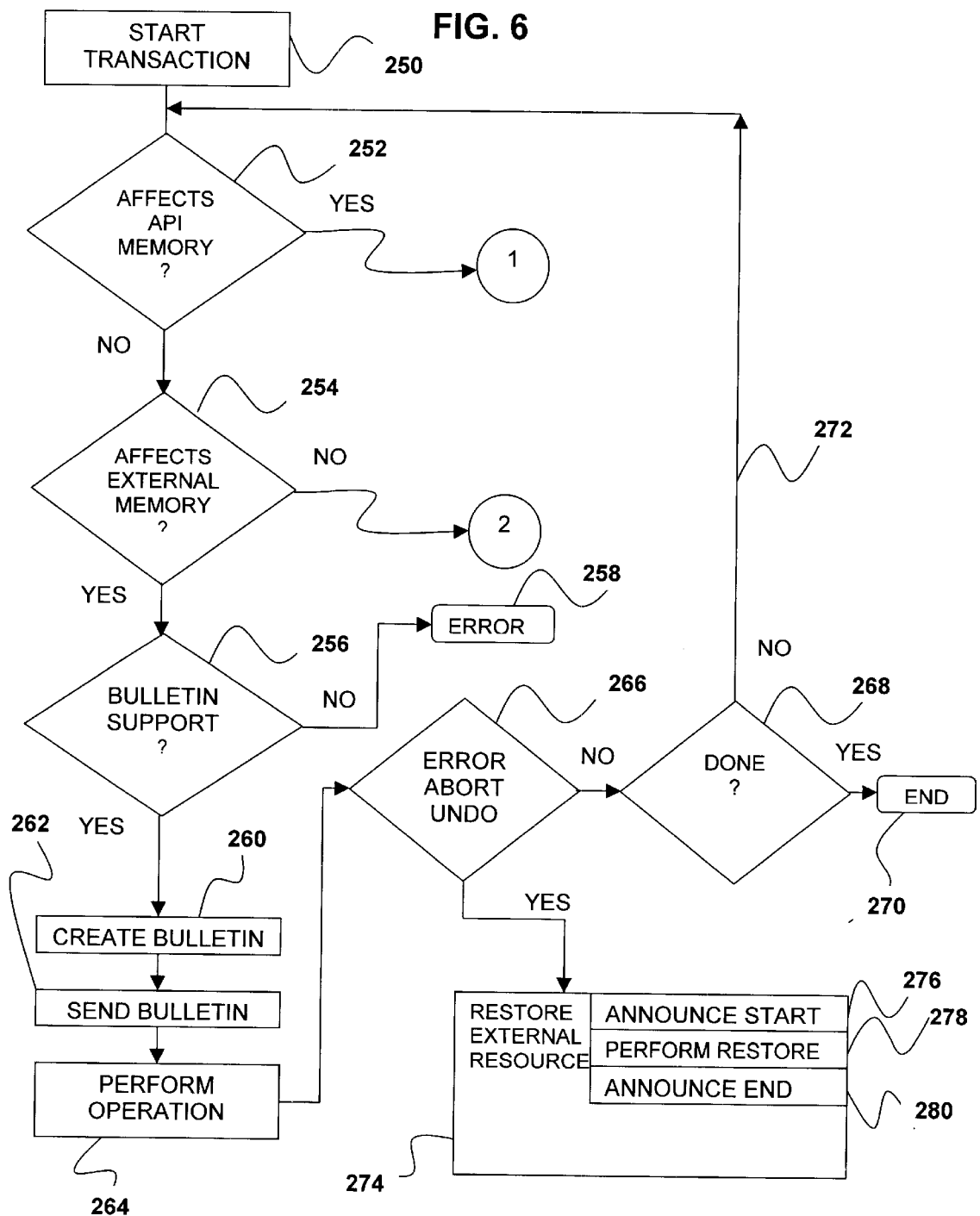
FIG. 6 is a flow chart for integrating an application written with the API with program memory not allocated with the API.

FIG. 6 is a flow chart for integrating an application written with the API with program memory not allocated with the API. Ideally, all memory events occur with protected memory, making it possible to automatically undo and redo all application program operations. However, in practice, this is not a realistic operation model.

A typical example is use of database services. Databases are complex and difficult to implement efficiently. Therefore, rather than write their own, developers frequently purchase a database API to provide database services for an application. The database services are likely to maintain private memory areas not under the control of the API-based application. Other examples include disk files, third-party run time libraries, and display data that is shown to a user (e.g., a pop-up information box).

Since these resources do not support the API's memory reversion system, this can cause instability with the undo operations, if part of the undo requires reversing effects to external resources. To get around these problems, bulletins can be used to encapsulate interaction with external non-API-based resources. A bulletin is used to track changes and provide state-reversion, undo, redo, and abort support. The bulletin itself emulates the preservation functions integrated into the API memory system. Consequently, the viability, reliability, and performance of the state-reversion, undo, redo, and abort operations are compromised according to the skill of the bulletin developer.

As shown, at step 250, a transaction is started. A (hardware) test 252 is then performed to identify whether some operation of the transaction affects preserved memory (e.g., memory allocated through an API function(s)). If so, then the memory is preserved as discussed above for FIG. 4 (e.g., block 154 et seq.). If not, then a test 254 is made to determine whether the operation affects an external resource, such as privately allocated memory. (Note that test 254 is program-design dependent; the programmer utilizing the API decides whether resource changes require support for state-reversion, undo, redo, and abort.) If not, then processing continues as discussed above for FIG. 5 (e.g., block 204 et seq.).

But, if the operation does impact external resources, a test 256 is performed to determine whether the external resource supports a bulletin to allow changes to the external resource to be undone. (Note that test 256 is also program-design dependent; the programmer utilizing the API decides whether bulletins are supported.) Although many external operations can be reversed, some cannot. For example, writing to a write-once media, or permanently deleting files, would not be reversible. In such situations, no such bulletin support is available, resulting in an error 258 condition. Such an error can be handled by indicating to a user that an undo operation is unavailable. However, it is understood that some operations, while irreversible, can still be "undone". An example is when program output is written to a permanent-storage media. Although the writing act itself cannot be undone, since the data that was written can be re-created, one can step back over the transaction. Redoing the transaction can be skipped (since the media will have not changed) or another write operation performed on new media.

If the test 256 indicates that the external resource supports bulletin-based tracking of the operation, then a bulletin is created 260 for the operation. In creating the bulletin, a current state of the external resource is preserved before the operation is performed.

Bulletins can have several formats. In one format, the bulletin completely describes the nature of the operation affecting external resources (e.g., changes to the resource are cached within the bulletin), and an undo operation is associated with the bulletin, so that the undo operation uses the cached data to automatically restore the external resource's state. In another format, rather than caching changes in a bulletin, instead a callback function (written by the third-party external-resource provider) is associated with an operation changing the external resource. (Alternatively, instead of associating with the operation, the function can be associated with the resource itself.) Note that possible side-effects of using bulletins can be minimized if one incorporates some of the external resource data into preserved memory (say by assigning a value to an object).

Note, however, that care is required when resources are acquired and released. It is important, for example, to not release (delete) resources when a possibility exists that an undo or redo will necessitate it being active again, particularly if there is some reason why it might not be able to be re-acquired (e.g., memory is scarce). In such cases, bulletins should hold onto the resource and not release it until the bulletin itself is destroyed. (Bulletins are destroyed when the owning transaction is deleted.) Committed transactions are deleted when older than the oldest transaction available for undo. All undone transactions are deleted when a new (subsequent) transaction is committed.

A bulletin can implement a difference-data (delta) approach similar to tracking changes to API-allocated memory. For example, if a file is being changed, it can be backed up and the differences stored for a later undo operation (e.g., parallel operations as used for memory preservation). Such an approach is very useful when the file data is highly compressible.

After the bulletin has been created and sent 262, the operation affecting an external resource can now be performed 264. After performing the operation, a test 266 is made to determine whether there was some error or attempt to abort or undo the operation. If not, a further test 268 is made to determine whether the transaction has completed. If so, transaction processing ends 270. If not, then processing loops back 272 to begin performance of the next operation within the transaction.

FIG. 7 and the following discussion are intended to provide a brief, general description of a suitable computing environment in which to implement the exemplary CAD application program written with an API providing automatic reversion support. The exemplary application program may be described by reference to different high-level program modules and/or low-level hardware contexts. Those skilled in the art will realize that program module references can be interchanged with low-level instructions.

Program modules include procedures, functions, programs, components, data structures, and the like, that perform particular tasks or implement particular abstract data types. The modules may be incorporated into single and multi-processor computing systems, as well as hand-held devices and controllable consumer devices. It is understood that modules may be implemented on a single computing device, or processed over a distributed network environment, where modules can be located in both local and remote memory storage devices.

An exemplary system for implementing the invention includes a computing device 302 having system bus 304 for coupling together various components within the computing device. The system 304 bus may be any of several types of bus structure including a memory bus or memory controller, a peripheral bus, and a local bus using any of a variety of conventional bus architectures such as PCI, AGP, VESA, Microchannel, ISA and EISA, to name a few. Note that only a single bus is illustrated, although plural buses typically achieve performance benefits. Typically, attached to the bus 302 are a processor 306, a memory 308, storage devices (e.g., fixed 310, removable 312, optical/laser 314), a video interface 316, input/output interface ports 318, and a network interface 320.

The processor 306 may be any of various commercially available processors, including Intel processors, or the DEC Alpha, PowerPC, programmable gate arrays, signal processors, or the like. Dual, quad processors, and other multi-processor architectures also can be used. The system memory includes random access memory (RAM) 322, and static or re-programmable read only memory (ROM) 324. A basic input/output system (BIOS), stored in ROM, contains routines for information transfer between device 302 components or device initialization.

The fixed storage 310 generally refers to hard drive and other semi-permanently attached media, whereas removable storage 312 generally refers to a device-bay into which removable media such as a floppy diskette is removably inserted. The optical/laser storage 314 include devices based on CD-ROM, DVD, or CD-RW technology, and are usually coupled to the system bus 304 through a device interface 326, 328, 330. The storage systems and associated computer-readable media provide storage of data and executable instructions for the computing device 302. Note that other storage options include magnetic cassettes, tapes, flash memory cards, memory sticks, digital video disks, and the like.

The exemplary computing device 302 can store and execute a number of program modules within the RAM 322, ROM 324, and storage devices 310, 312, 314. Typical program modules include an operating system 332, application programs 334 (e.g., a web browser or network application program), etc., and application data 336. Program module or other system output can be processed by the video system 316 (e.g., a 2D and/or 3D graphics rendering device), which is coupled to the system bus 304 and an output device 338. Typical output devices include monitors, flat-panels displays, liquid-crystal displays, and recording devices such as video-cassette recorders.

The operating system 332 is assumed to include the ability to protect some unit of memory against write access, throw an access violation exception when a subsequent write access occurs on that memory, and allow the memory to be unprotected and have program execution continue with the instruction causing the exception. Thus, program preemption will be transparent to the program. If the operating system does not natively include such memory support, it will be emulated, such as through extensions to the operating system, or through a program execution wrapper (surrounding execution environment).

A user of the computing device 302 is typically a person interacting with the computing device through manipulation of an input device 340. Common input devices include a keyboard, mouse, tablet, touch-sensitive surface, digital pen, joystick, microphone, game pad, satellite dish, etc. One can also provide input through manipulation of a virtual reality environment, or through processing the output from a data file or another computing device.

The computing device 302 is expected to operate in a networked environment using logical connections to one or more remote computing devices. One such remote computing device 342 may be a web server or other program module utilizing a network application protocol (e.g., HTTP, File Transfer Protocol (FTP), Gopher, Wide Area Information Server (WAIS)), a router, a peer device or other common network node, and typically includes many or all of the elements discussed for the computing device 302. The computing device 302 has a network interface 320 (e.g., an Ethernet card) coupled to the system bus 304, to allow communication with the remote device 342. Both the local computing device 302 and the remote computing device 342 can be communicatively coupled to a network 344 such as a WAN, LAN, Gateway, Internet, or other public or private data-pathway. It will be appreciated that other communication links between the computing devices, such as through a modem 346 coupled to an interface port 318, may also be used.

In accordance with the practices of persons skilled in the art of computer hardware and software programming, the present invention is described with reference to acts and symbolic representations of operations that are sometimes referred to as being computer-executed. It will be appreciated that the acts and symbolically represented operations include the manipulation by the processor 306 of electrical signals representing data bits which causes a resulting transformation or reduction of the electrical signal representation, and the maintenance of data bits at memory locations in the memory 308 and storage systems 310, 312, 314, so as to reconfigure or otherwise alter the computer system's operation and/or processing of signals. The memory locations where data bits are maintained are physical locations having particular electrical, magnetic, or optical properties corresponding to the data bits.

Having described and illustrated the principles of the invention with reference to illustrated embodiments, it will be recognized that the illustrated embodiments can be modified in arrangement and detail without departing from such principles.

For example, while the foregoing description focused—for expository convenience—on a CAD application program, it will be recognized that the same techniques and analyses can be applied to different programs and programming environments, such as word processors, spreadsheets, databases, compilers, program editors and graphical editors. Consequently, in view of the wide variety of programs and programming environments that would benefit from automatic reversion support (e.g., automatic support for state-reversion, undo, redo and abort operations), the detailed embodiments are intended to be illustrative only, and should not be taken as limiting the scope of the invention.

Rather, what is claimed as the invention, is all such modifications as may come within the scope and spirit of the following claims and equivalents thereto.

What is claimed is:

1. A method for memory-based state-reversion of a model, said model having a queue of memory states tracking state changes over time by application of a transaction to a current memory state, said transaction resulting in a subsequent memory state added to the queue, the method comprising:

receiving a first transaction for the model, said model having a first memory state;

applying the first transaction to the model, resulting in a second memory state;

tracking changes to the model between said first and second memory states;

receiving a state-reversion request to revert back to the first memory state; and creating, in response to said state-reversion request, a new memory state equivalent to the first memory state.

2. A method according to claim 1, in which before receiving the memory state reversion request, the method further comprising:

receiving a second transaction for the model, said model in the second memory state;

applying the second transaction to the model, resulting in a third memory state; and tracking changes to the model between said second and third memory states;

wherein both second and third memory states are retained after receiving the state-reversion request.

3. A method according to claim 2, further comprising:

receiving a request to undo the state-reversion;

deleting the new memory state; and reinstating the third memory state as the current memory state of the model.

4. A method according to claim 1, in which the model is stored in a first memory, and where tracking changes between memory states comprises:

monitoring changes to the first memory during application of a particular transaction, said first memory having an initial memory state before said application, and a final memory state after said application;

identifying changes between said initial and final memory states;

recording said identified changes in a second memory to allow reversing said identified changes.

5. A method according to claim 4, wherein creating the new memory state comprises reversing said identified changes recorded in the second memory to re-create the first memory state of the model.

6. A method according to claim 5, wherein a history of memory changes is maintained for a series of transactions, such that the state-reversion request may target any transaction within the series so as to result in the new memory state corresponding to said targeted transaction.

7. An article of manufacture comprising a computing-device readable medium having encoded thereon instructions capable of directing a processor to perform the operations of:

receiving a first transaction for the model, said model having a first memory state in a queue of memory states tracking memory state changes for the model;

applying the first transaction to the model, resulting in a second memory state added to the queue;

tracking changes to the model between said first and second memory states;

receiving a state-reversion request to revert back to the first memory state; and creating, in response to said state-reversion request, a new memory state in the queue equivalent to the first memory state.

8. A method for memory-based state-reversion of a model, said model having a queue of memory states tracking state changes over time by application of a transaction to a current memory state, said transaction resulting in a subsequent memory state added to the queue, the method comprising:

step for receiving a first transaction for the model, said model having a first memory state in the queue;

step for applying the first transaction to the model, resulting in a second memory state;

step for tracking changes to the model between said first and second memory states;

step for receiving a state-reversion request to revert back to the first memory state; and step for creating, in response to said state-reversion request, a new memory state in the queue equivalent to the first memory state.

9. A method according to claim 8, further comprising:

step for receiving a request to undo the state-reversion;

step for deleting the new memory state; and step for reinstating the third memory state as the current memory state of the model.

10. A method according to claim 8, in which the model is stored in a first memory, and where tracking changes between memory states comprises:

step for monitoring changes to the first memory during application of a particular transaction, said first memory having an initial memory state before said application, and a final memory state after said application;

step for identifying changes between said initial and final memory states;

step for recording said identified changes in a second memory to allow reversing said identified changes.

11. A method according to claim 10, wherein creating the new memory state comprises step for reversing said identified changes recorded in the second memory to re-create the first memory state of the model.

12. An article of manufacture comprising a computing-device readable medium having encoded thereon instructions capable of directing a processor to perform the operations of:

step for receiving a first transaction for the model, said model having a first memory state;

step for applying the first transaction to the model, resulting in a second memory state;

step for tracking changes to the model between said first and second memory states;

step for receiving a state-reversion request to revert back to the first memory state; and step for creating, in response to said state-reversion request, a new memory state equivalent to the first memory state.

13. A system for state-reversion of a model, said model having current memory states which change over time into subsequent memory states by application of transactions to current memory states, the method comprising:

a first receiving arrangement for receiving a first transaction for the model, said model having a first memory state in a queue of memory states tracking memory state changes for the model;

means for applying the first transaction to the model, resulting in a second memory state in the queue;

a tracking arrangement for tracking changes to the model between said first and second memory states;

a second receiving arrangement for receiving a state-reversion request to revert back to the first memory state; and means for creating, in response to said state-reversion request, a new memory state in the queue equivalent to the first memory state.

14. A system according to claim 13, further comprising:

a third receiving arrangement for receiving a request to undo the state-reversion;

a deleting arrangement for deleting the new memory state; and means for reinstating the third memory state as the current memory state of the model in the queue.

15. A system according to claim 13, further comprising:

a first memory for storing the model;

a first monitoring arrangement configured to monitor application of a transaction;

a second monitoring arrangement configured to monitor changes from an initial memory state of the first memory to a final memory state of the first memory due to said monitored transaction;

means for recording said monitored changes in a second memory.

16. A system according to claim 15, further comprising a state-reversion arrangement configured to reverse said monitored changes recorded in the second memory.

* * * * *